(12) United States Patent
Yoo

(10) Patent No.: US 10,128,778 B2
(45) Date of Patent: Nov. 13, 2018

(54) ENERGY HARVESTER

(71) Applicant: Hyundai Motor Company, Seoul (KR)

(72) Inventor: Il Seon Yoo, Seoul (KR)

(73) Assignee: Hyundai Motor Company, Seoul (KR)

(*) Notice: Subject to any disclaimer, the term of this patent is extended or adjusted under 35 U.S.C. 154(b) by 160 days.

(21) Appl. No.: 15/082,803

(22) Filed: Mar. 28, 2016

(65) Prior Publication Data

US 2017/0163179 A1 Jun. 8, 2017

(30) Foreign Application Priority Data

Dec. 7, 2015 (KR) .................. 10-2015-0172930

(51) Int. Cl.
*H02K 35/02* (2006.01)
*H02N 2/18* (2006.01)
*H01L 41/113* (2006.01)

(52) U.S. Cl.
CPC ............ *H02N 2/186* (2013.01); *H02K 35/02* (2013.01); *H01L 41/1134* (2013.01); *H01L 41/1136* (2013.01)

(58) Field of Classification Search
USPC .......................................... 307/72
See application file for complete search history.

(56) References Cited

U.S. PATENT DOCUMENTS 8,354,778 B2 * 1/2013 Arnold ............... H02K 7/1892
310/370
2011/0215590 A1 9/2011 Arnold et al.

FOREIGN PATENT DOCUMENTS

| CN | 102594205 | | 7/2012 |
|---|---|---|---|
| CN | 103023378 | | 4/2013 |
| JP | 2012-151986 | A | 8/2012 |
| JP | 2012-151986 | * | 9/2012 |
| KR | 10-2010-0037992 | | 4/2010 |
| KR | 10-1298028 | | 8/2013 |
| KR | 10-1301695 | B1 | 8/2013 |
| KR | 10-1317335 | B1 | 10/2013 |
| KR | 10-2014-0010752 | | 1/2014 |
| KR | 10-1501023 | | 3/2015 |

* cited by examiner

*Primary Examiner* — Rexford Barnie
*Assistant Examiner* — Xuan Ly
(74) *Attorney, Agent, or Firm* — Mintz Levin Cohn Ferris Glovsky and Popeo, P.C.; Peter F. Corless

(57) ABSTRACT

An energy harvester is provided. The energy harvester includes a housing, a permanent magnet that is disposed within the housing, and a mass body that has a relative position to the permanent magnet changed by a translational motion within the housing by vibration energy from the exterior and that is formed of a magnetic substance. Further, a piezoelectric body generates electricity while elastically supporting vibration with respect to the housing of the permanent magnet by the translational motion of the mass body and an induction coil is disposed within the housing to generate induction electricity based on the vibration of the permanent magnet.

8 Claims, 5 Drawing Sheets

ENERGY HARVESTER

CROSS REFERENCE TO RELATED APPLICATION

This application claims the benefit of Korean Patent Application No. 10-2015-0172930, filed on Dec. 7, 2015, entitled "Energy Harvester", which is hereby incorporated by reference in its entirety into this application.

BACKGROUND

1. Technical Field

The present invention relates to a technology for an apparatus equipped in vehicles, and more particularly to a technology to harvest various types of wasted energies.

2. Description of the Related Art

Generally, an energy harvester includes an apparatus for harvesting various types of wasted energies. In particular, in vehicles, vibration energy may be aperiodic and may have different scattered resonance frequencies. When vehicles harvest the vibration energy and thereby use the harvested vibration energy as a power source, an improvement in fuel efficiency is provided. However, current apparatuses for harvesting vibration energy utilize a single resonance frequency that may have limited energy harvesting capabilities and a multi-resonance frequency is in an array form and therefore increases a volume of a system. In particular, a high-efficiency energy harvester capable of converting vibration energy into electric energy independent of the resonance frequency has been required for use in vehicles.

The information disclosed in this section is merely for enhancement of the understanding for the background of the invention and therefore it may contain information that does not form the prior art that is already known in this country to those of ordinary skill in the art.

SUMMARY

The present invention provides an energy harvester capable of improved vehicle mountability by occupying a reduced volume and improves harvesting energy efficiency by converting vibration energy generated from vehicles into electric energy independent of a resonance frequency.

In accordance with one aspect of an exemplary embodiment of the present invention, an energy harvester may include a housing, a permanent magnet disposed within the housing, a mass body installed to have a relative position to the permanent magnet may be adjusted by a translational motion within the housing by vibration energy from the exterior and formed of a magnetic substance. Further, a piezoelectric body may be configured to generate electricity while elastically supporting vibration with respect to the housing of the permanent magnet by the translational motion of the mass body. An induction coil disposed within the housing may be configured to generate induction electricity based on the vibration of the permanent magnet.

In some aspects, the housing may include a guide chamber configured to guide the translational motion of the mass body. For example, a plurality of both ends of the guide chamber may include elastic bodies that buffer the translational motion of the mass body. The housing may include a vibration chamber configured to vibrate the permanent magnet at a position adjacent to the guide chamber. The piezoelectric body may elastically support the permanent magnet to the housing so that the permanent magnet vibrates in a vertical direction to the translational motion direction of the mass body. The piezoelectric body may be formed of a piezoelectric film parallel with the translational motion direction of the mass body. The permanent magnet may be disposed separated from an interior wall of the housing due to the piezoelectric film.

A plurality of permanent magnets supported by the piezoelectric film may overlap with each other in the vertical direction to the translational motion direction of the mass body within the vibration chamber. The permanent magnets may be disposed to overlap with each other while having the same polarity disposed in an adjacent direction. The induction coil may be wound around an exterior surface of the vibration chamber of the housing. The piezoelectric body may elastically couple the permanent magnet to the housing to configure the permanent magnet to vibrate in a parallel direction to the translational motion direction of the mass body. The plurality of permanent magnets may be coupled to the housing by the piezoelectric body to allow each of the same polarity directions to be toward the translational motion direction of the mass body.

According to another exemplary embodiment of the present invention, an energy harvester, may include a housing, a permanent magnet configured to be translationally displaced within the housing by vibration energy from the exterior, a mass body disposed within the housing to be vibrated by a change in magnetic field changed based on the translational motion of the permanent magnet and formed of a magnetic substance. Further, a piezoelectric body may be configured to generate electricity by a displacement that occurs upon vibration of the mass body while the mass body is elastically coupled to the housing; and an induction coil may be disposed within the housing configured to generate induction electricity based on the translation motion of the permanent magnet.

In some exemplary embodiments, both ends of a path of the translational motion of the permanent magnet may each include support permanent magnets having the same polarity as polarities of both sides of the permanent magnet to provide a repulsive force pushing the permanent magnet toward a center of the path. A combination of the mass body and the piezoelectric body supporting the mass body to the housing may be provided in plural to be parallel to each other along a path of the translational motion of the permanent magnet.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
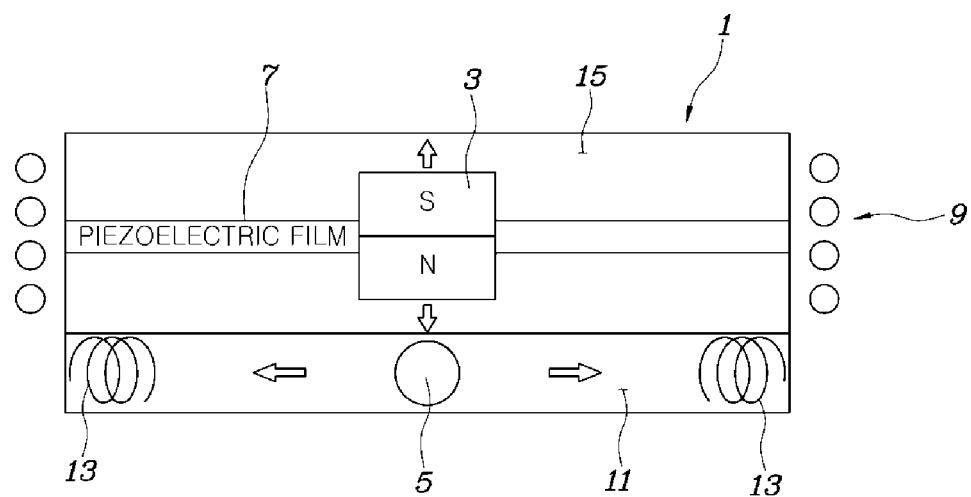
FIG. 1 is an exemplary configuration diagram illustrating an energy harvester according to a first exemplary embodiment of the present invention.

Reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims. Wherever possible, the same reference numbers will be used throughout the drawings to refer to the same or like parts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Referring to FIG. 1, according to the first through third exemplary embodiments of the present invention, an energy harvester may include a housing 1, a permanent magnet 3 disposed within the housing, a mass body 5 installed to have a relative position to the permanent magnet 3 adjusted by a translational motion within the housing 1, by vibration energy from the exterior and formed of a magnetic substance. Further a piezoelectric body 7 may be configured to generate electricity while elastically supporting vibration with respect to the housing 1 of the permanent magnet 3 by the translational motion of the mass body 5. Additionally an induction coil 9 disposed within the housing 1 may be configured to generate induction electricity based on a vibration of the permanent magnet 3. In other words, when applied with the vibration energy from the exterior, the translational motion of the mass body 5 may be generated, further generating the vibration of the permanent magnet 3. In particular, the induction coil 9 may be configured to generate electricity by the vibration of the permanent magnet 3 and the piezoelectric body 7 may be configured to generate electricity by the vibration the permanent magnet 3.

Further, as described above, the electricity generated from the piezoelectric body 7 and the induction coil 9 may be stored in a battery, etc., or may be used to drive electric loads. The housing 1 may include a guide chamber 11 configured to guide or direct the translational motion of the mass body 5. Additionally, a plurality of (e.g., both) ends of the guide chamber 11 may include an elastic body 13 which may buffer the translational motion of the mass body. The housing 1 may include a vibration chamber 15 that may be configured to vibrate the permanent magnet 3 at a position adjacent to the guide chamber 11. The piezoelectric body 7 may elastically supports (e.g., couple) the permanent magnet 3 to the housing 1 to vibrate the permanent magnet 3 in a vertical direction to the translational motion direction of the mass body 5. The induction coil 9 may be configured to be wound around an exterior surface of the vibration chamber 15 of the housing 1 or to be disposed within the vibration chamber 15. The foregoing contents are common to the first to third exemplary embodiments of the present invention.

Figure 3:
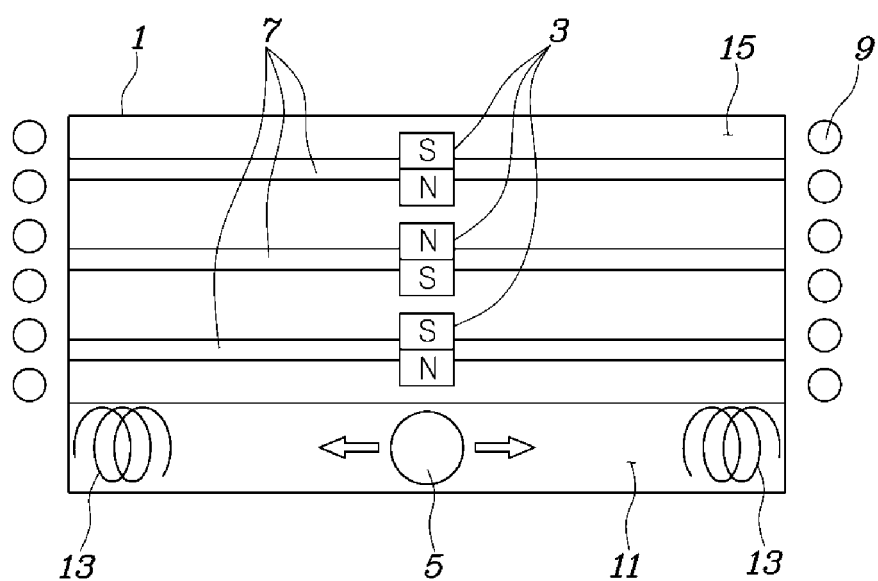
FIG. 3 is an exemplary configuration diagram illustrating an energy harvester according to a second exemplary embodiment of the present invention.

In the first and second exemplary embodiments, the piezoelectric body 7 may be formed of a piezoelectric film parallel to the translational motion direction of the mass body 5 and the permanent magnet 3 may be disposed separated from an interior wall of the housing 1 due to the piezoelectric film. As shown the second exemplary embodiment of FIG. 3, a plurality of permanent magnets supported by the piezoelectric film may be provided to overlap with each other in the vertical direction to the translational motion direction of the mass body 5 within the vibration chamber 15. Further, the permanent magnets 3 may be disposed to overlap with each other while having the same polarity disposed in an adjacent direction. Therefore, compared to the first exemplary embodiment, according to the second exemplary embodiment, a greater portion of the electricity may be generated from the induction coil 9 and the piezoelectric body 7 by an increased movement of the permanent magnets.

Figure 4:
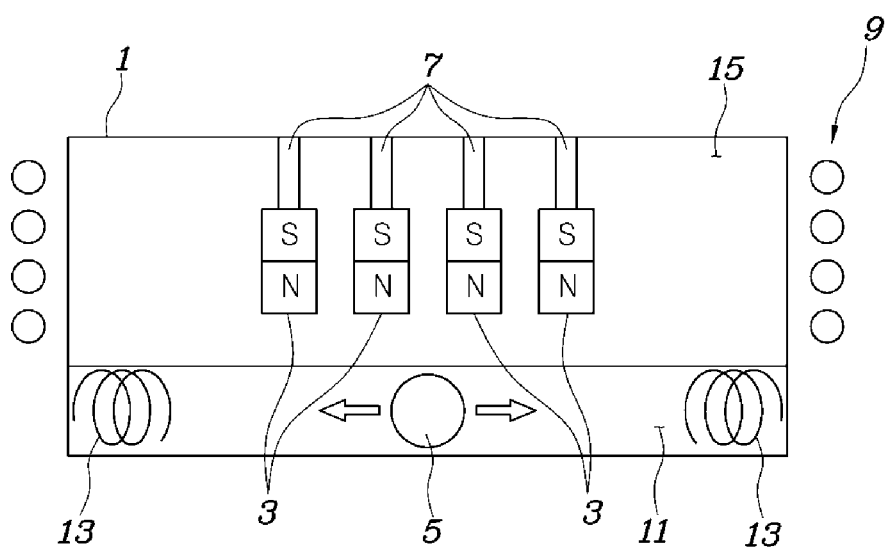
FIG. 4 is an exemplary configuration diagram illustrating an energy harvester according to a third exemplary embodiment of the present invention.

Moreover, in the third exemplary embodiment as shown in FIG. 4, the piezoelectric body 7 may be configured to elastically support (e.g., couple) the permanent magnet 3 to the housing. Additionally, the permanent magnet 3 may be configured to vibrate in a parallel direction to the translational motion direction of the mass body 5. In other words, the plurality of permanent magnets 3 may be support the housing 1 by the piezoelectric body 7 to direct each of the same polarity directions toward the translational motion direction of the mass body 5. In particular, when the translational motion of the mass body 5 to the vibration energy from the exterior is generated, the plurality of permanent magnets 3 may be configured to generate electricity from the induction coil 9 and the piezoelectric body 7 while being sequentially vibrated by the motion of the mass body 5.

Figure 5:
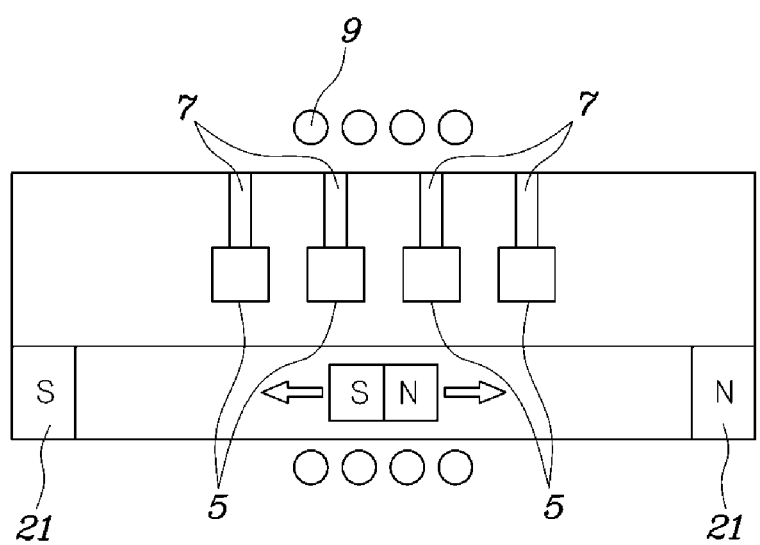
FIG. 5 is an exemplary configuration diagram illustrating an energy harvester according to a fourth exemplary embodiment of the present invention.

Referring to FIG. 5, according to a fourth exemplary embodiment of the present invention, an energy harvester may include a housing 1, a permanent magnet 3 to be translationally displaced within the housing 1 by vibration energy from the exterior; a mass body 5 disposed within the housing 1 configured to be vibrated by a change in magnetic field changed based on the translational motion of the permanent magnet 3 and formed of a magnetic substance. Further, a piezoelectric body 7 may be configured to generate electricity by a displacement occurring upon vibration of the mass body 5 while elastically supporting the mass body 5 to the housing. An induction coil 9 may be disposed within the housing 1 to generate induction electricity based on the translation motion of the permanent magnet 3.

In other words, unlike the first to third exemplary embodiments, an object may be displaced based on the external vibration energy of the permanent magnet 3. For example, electricity may be generated from the piezoelectric body 7 while the mass body 5 which is the magnetic substance may be vibrated based on the translational motion of the permanent magnet 3. The induction coil 9 may be configured to generate electricity that corresponds to the motion of the permanent magnet 3. On the contrary to the foregoing exemplary embodiments, the permanent magnet 3 and the mass body 5 may perform an opposite role to each other.

According to the present exemplary embodiment, both ends of a path of the translational motion of the permanent magnet 3 may each include support permanent magnets 21 having the same polarity as polarities of both sides of the permanent magnet 3 to provide a repulsive force pushing the permanent magnet 3 toward a center of the path. In particular, the shock or the vibration may not be generated due to the motion of the permanent magnet 3 maybe prevented. In other words, the translational motion of the permanent magnet 3 may be more smoothly and flexibly performed. According to the present exemplary embodiment, a combination of the mass body 5 and the piezoelectric body 7 supporting the mass body 5 to the housing 1 may be disposed parallel to each other along the path of the translational motion of the permanent magnet 3.

Figure 2A:
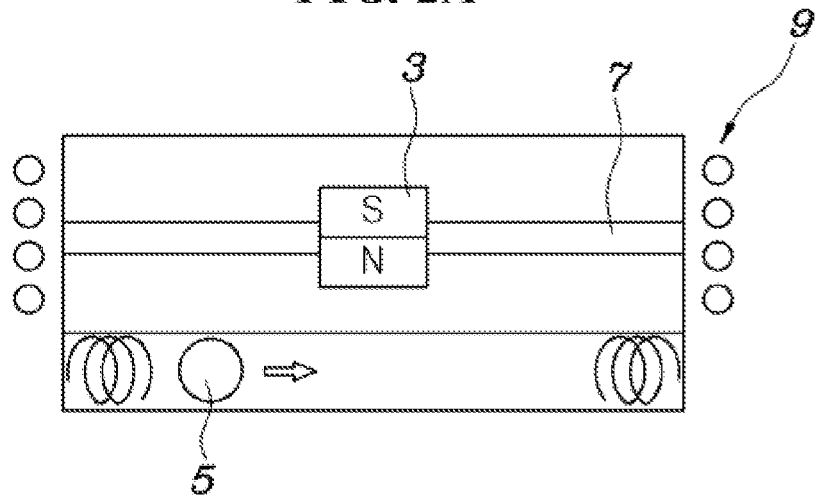
FIGS. 2A to 2C are exemplary diagrams for describing an operation of the first exemplary embodiment of FIG. 1.
Figure 2B:
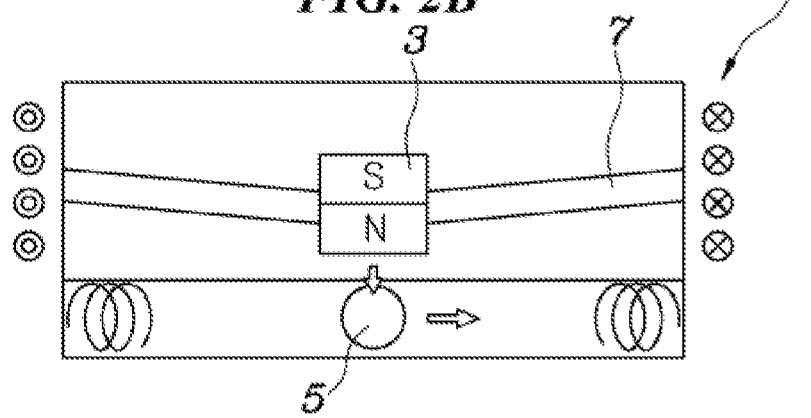
Figure 2C:
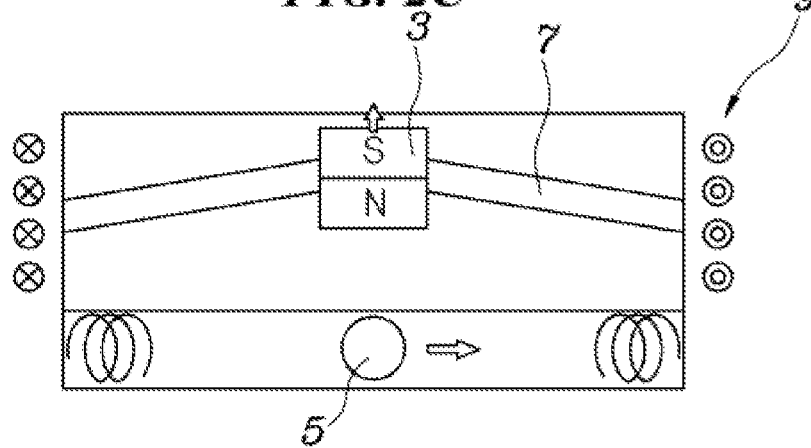

The operation of the first exemplary embodiment among the exemplary embodiments of the energy harvester of the present invention configured as described above will be described with reference to FIGS. 2A-2C. FIG. 2A illustrates a normal state before the input of the external vibration energy. In other words, a state that is prior to generation of an electromagnetic induction effect by the vibration motion of the permanent magnet 3 or a piezoelectric effect by an elastic deformation of the piezoelectric body 7. FIG. 2B illustrates that the mass body 5 moves from the A state by inputting the vibration energy from the exterior of the housing 1. For example, the permanent magnet 3 may be actuated downward by the motion of the mass body 5 of the magnetic substance. The induction coil 9 may be configured to generate the induction current by the electromagnetic induction by the motion of the permanent magnet 3 and the piezoelectric body 7 may be configured to generate electricity by the piezoelectric effect. FIG. 2C illustrates that the mass body 5 passes around the permanent magnet 3 and then may be displaced therefrom. For example, the permanent magnet 3 may elastically move in an opposite direction to the B by the elastic force of the piezoelectric body 7, accordingly, the induction coil 9 and the piezoelectric body 7 may be configured to generate electricity.

In the case of the energy harvester as described above, since the mass body 5 may move freely move within the guide chamber 11 without being fixed to the housing 1 by the elastic body, there is no specific resonance frequency. Accordingly, the magnetic substance 5 may be translationally displaced by reacting to the vibration energy of various frequencies scattered in a vehicle. The permanent magnet 3 may be displaced and energy may be recovered using both of the electromagnetic induction and the piezoelectric effect for the motion of the permanent magnet 3, thereby more effectively harvesting and recovering the vibration energy of various frequencies.

For reference, the fourth exemplary embodiment of FIG. 5 may be substantially similar to the first exemplary embodiment in the operation that the translational motion of the permanent magnet for the external vibration energy and the vibration motion of the mass body corresponding to the translational motion generate electricity using the electromagnetic induction and the piezoelectric effect and may be intuitively understood and therefore the detailed description thereof will be omitted. According to the exemplary embodiments of the present invention, the energy harvester may have improved vehicle mountability by occupying a reduced volume and harvest energy at high efficiency by converting the vibration energy generated from vehicles into the electric energy independent of the resonance frequency.

Although the present invention has been shown and described with respect to specific exemplary embodiments, it will be obvious to those skilled in the art that the present invention may be variously modified and altered without departing from the spirit and scope of the present invention as defined by the following claims. The exemplary embodiments should be considered in a descriptive sense only and not for purposes of limitation.

What is claimed is:

1. An energy harvester, comprising:
   a housing;
   a permanent magnet disposed within the housing;
   a mass body disposed in a relative position to the permanent magnet configured to be adjusted by a translational motion within the housing by vibration energy from an exterior wherein the mass body is formed of a magnetic substance;
   a piezoelectric body configured to generate electricity while elastically supporting vibration with respect to the housing of the permanent magnet by the translational motion of the mass body; and
   an induction coil disposed within the housing to generate induction electricity based on the vibration of the permanent magnet,
   wherein the housing includes a guide chamber configured to guide the translational motion of the mass body, both ends of the guide chamber include elastic bodies buffering the translational motion of the mass body, and the housing includes a vibration chamber configured to vibrate the permanent magnet at a position adjacent to the guide chamber.

2. The energy harvester of claim 1, wherein the piezoelectric body elastically couples the permanent magnet to the housing to vibrate the permanent magnet is in a vertical direction to a translational motion direction of the mass body.

3. The energy harvester of claim 2, wherein the piezoelectric body is formed of a piezoelectric film parallel with the translational motion direction of the mass body, and the permanent magnet is disposed separated from an interior wall of the housing due to the piezoelectric film.

4. The energy harvester of claim 3, wherein a plurality of permanent magnets supported by the piezoelectric film overlap with each other in the vertical direction to the translational motion direction of the mass body within the vibration chamber.

5. The energy harvester of claim 4, wherein the permanent magnets are disposed to overlap with each other while having the same polarity disposed in an adjacent direction.

6. The energy harvester of claim 3, wherein the induction coil is wound around an exterior surface of the vibration chamber of the housing.

7. The energy harvester of claim 1, wherein the piezoelectric body elastically couples the permanent magnet to the housing to vibrate the permanent magnet is in a parallel direction to the translational motion direction of the mass body.

8. The energy harvester of claim 6, wherein the plurality of permanent magnets are coupled to the housing by the piezoelectric body to direct each of the same polarity directions toward the translational motion direction of the mass body.

* * * * *